(12) United States Patent
Kim

(10) Patent No.: US 7,535,084 B2
(45) Date of Patent: May 19, 2009

(54) MULTI-CHIP PACKAGE WITH A SINGLE DIE PAD

(75) Inventor: Hong Hyoun Kim, Kyunggi-do (KR)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 36 days.

(21) Appl. No.: 11/749,441

(22) Filed: May 16, 2007

(65) Prior Publication Data

US 2008/0224294 A1 Sep. 18, 2008

(30) Foreign Application Priority Data

Mar. 16, 2007 (TW) .............................. 96109045 A

(51) Int. Cl.
*H01L 23/495* (2006.01)

(52) U.S. Cl. .............. 257/666; 257/670; 257/692; 257/696; 257/777; 257/778; 257/E23.031; 257/E23.037; 257/E23.043; 257/E23.046; 257/E23.047

(58) Field of Classification Search ......... 257/666–667, 257/692, 696, 777, 778, E23.031–E23.059; 438/111, 112, 123, FOR. 366, FOR. 367, 438/FOR. 377, FOR. 380
See application file for complete search history.

(56) References Cited

U.S. PATENT DOCUMENTS

| | | | | |
|---|---|---|---|---|
| 6,118,184 A | * | 9/2000 | Ishio et al. | 257/787 |
| 6,977,431 B1 | | 12/2005 | Oh et al. | |
| 7,239,008 B2 | * | 7/2007 | Nakamura | 257/666 |

* cited by examiner

*Primary Examiner*—Jasmine J Clark

(57) ABSTRACT

A multi-chip package with a single die pad is provided. The multi-chip package includes a leadframe having a die pad and a plurality of leads surrounding the die pad. Each of the leads includes an upper lead, a lower lead and an intermediate lead substantially perpendicularly connected to the upper and lower leads, wherein the upper and lower leads are substantially parallel to the die pad. The upper and lower surfaces of the die pad are attached with upper and lower chips respectively. The upper chip is electrically connected to the upper surface of one part of the upper leads by a plurality of first bonding wires and the lower chip is electrically connected to the lower surfaces of the other part of the upper leads by a plurality of second bonding wires. A sealant is used to encapsulate the chips and bonding wires to protect these elements from damage.

10 Claims, 3 Drawing Sheets

MULTI-CHIP PACKAGE WITH A SINGLE DIE PAD

CROSS REFERENCE TO RELATED APPLICATION

This application claims the priority benefit of Taiwan Patent Application Serial Number 096109045 filed Mar. 16, 2007, the full disclosure of which is incorporated herein by reference.

BACKGROUND OF THE INVENTION

1. Field of the Invention

The invention relates to a semiconductor package, and more particularly, to a multi-chip semiconductor package.

2. Description of the Related Art

As electronic products are getting smaller and lighter, the packages for protecting and interconnecting IC chips also have the same trend.

With ever-increasing demands for miniaturization and higher operating speeds, multi-chip packages have become an attractive approach in a variety of electronic device. Multi-chip packages, which contain two or more chips in a single package, can help minimize the limitation in system operation speed. In addition, multi-chip packages are capable of decreasing the interconnection length between IC chips thereby reducing signal delays and access times.

Referring to FIG. 1, a conventional stacked chip package 10 includes a substrate 11 with a chip 12 disposed thereon. The chip 12 is electrically connected to the substrate 11 by a plurality of bumps 14. A chip 13 is stacked on the chip 12 and electrically connected to the chip 12 by a plurality of bumps 15. A sealant 16 is disposed on the substrate 11 and used to encapsulate the chips 12, 13 to protect these chips from damage.

However, the package 10 uses a substrate, not a leadframe to carry chips. Moreover, it is not feasible to stack another package on the package 10.

Referring to FIG. 2, U.S. Pat. No. 6,977,431 discloses a stackable semiconductor package 200. The package 200 includes a metal die pad 110, a plurality of metal leads 115, each of which includes an inner lead portion 120 embedded in a plastic sealant 170 and an outer lead portion 130 that is fully disposed outside of the sealant 170. The die pad 110 includes an approximately planar first surface 111 and an approximately planar second surface 112 that is opposed to the first surface 111. A chip 140 is positioned in the sealant 170 and mounted to the second surface 112 of the die pad 110. A plurality of conductive wires 160 electrically connects the chip 140 to the inner lead portions 120. The first surface 111 of the die pad 110 is fully exposed out of the first surface 171 of the sealant 170.

Referring to FIG. 3, the above-mentioned U.S. patent also discloses that another semiconductor package 300 is capable of being stacked on the first surface 171 of the sealant 170 of the package 200. The package 300 includes a die pad 210 with a chip 230 disposed on the upper surface thereof. A plurality of conductive wires 250 is used to electrically connect the chip 230 to the leads 220 surrounding die pad 210. The chip 230, upper surface of the die pad 210 and upper surfaces of the leads 220 are covered by a sealant 260. The lower surface of the die pad 210 and lower surfaces of the leads 220 are exposed out of the sealant 260. A conductive layer 270 made of such as metal solder or conductive epoxy-based material is disposed between the packages 200 and 300 so as to electrically connect the lower surface of the die pad 210 to the first surface 111 of the die pad 110 and to electrically connect the leads 220 to the inner lead portions 120 of the leads 115.

Although the assembly of the package 200 and package 300 contains two chips 140 and 230, the assembly uses two die pads 110, 210 to respectively carry the chips 140 and 230. This will cause an increase in material cost.

Accordingly, there exists a need to provide a multi-chip package to solve the above-mentioned problems.

SUMMARY OF THE INVENTION

It is an object of the present invention to provide a multi-chip package that uses only a single leadframe to carry more than one chip.

In order to achieve the above object, the multi-chip package of the present invention includes a leadframe having a die pad and a plurality of leads surrounding the die pad. Each of the leads includes an upper lead, a lower lead disposed below the upper lead and an intermediate lead substantially perpendicularly connected to the upper and lower leads, wherein the upper and lower leads are substantially parallel to the die pad. An upper chip and a lower chip are attached to the upper and lower surfaces of the die pad respectively. The upper chip is electrically connected to the upper surfaces of the upper leads of one part of the leads by a plurality of first bonding wires. The lower chip is electrically is electrically connected to the lower surfaces of the upper leads of the other part of the leads by a plurality of second bonding wires. A sealant is used to encapsulate the chips, bonding wires to protect these elements from damage.

As the multi-chip package of the present invention uses only a single leadframe to carry more than one chip in a package, the material cost can be decreased accordingly. Moreover, since the chips are disposed respectively on the opposing surfaces of the die pad and when the tie bars are electrically connected to external ground traces, the die pad can function as an electromagnetic interference shielding for these chips and therefore the interference between these chips can be avoided. Also, the die pad can function as thermal paths to dissipate the heat generated from the chips when they operate to the environment.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
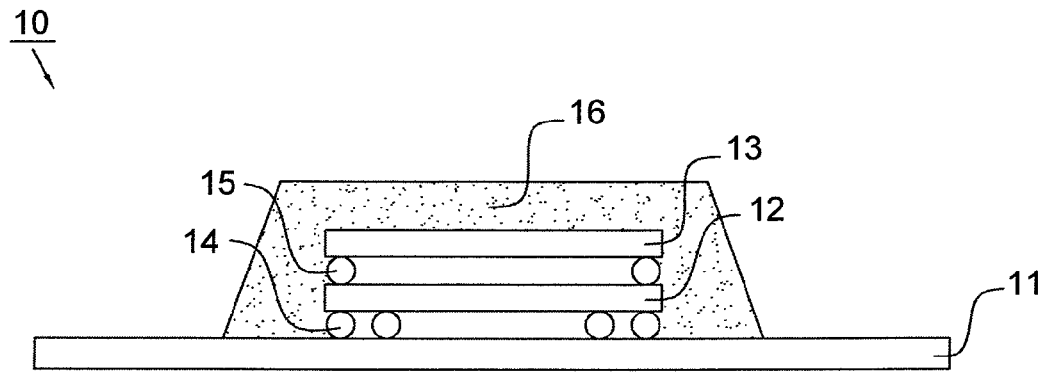
FIG. 1 is a cross-sectional view of a conventional multi-chip package.
Figure 2:
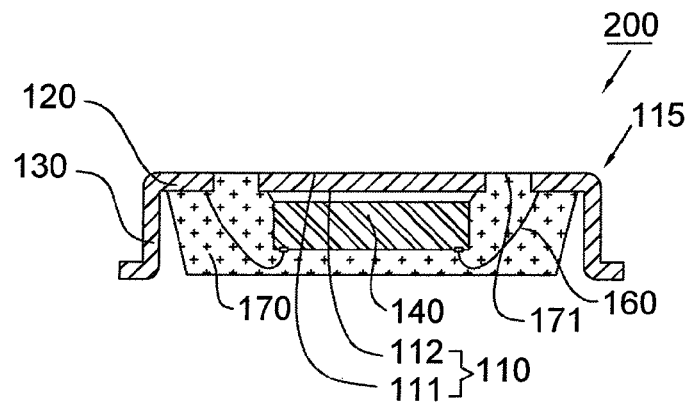
FIG. 2 is a cross-sectional view of a conventional stackable semiconductor package.
Figure 3:
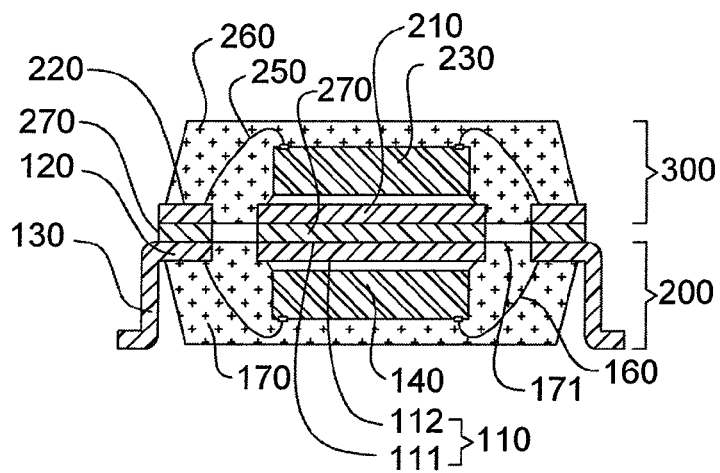
FIG. 3 is a cross-sectional view illustrating that another semiconductor package is stacked on the semiconductor package of FIG. 2.
Figure 4A:
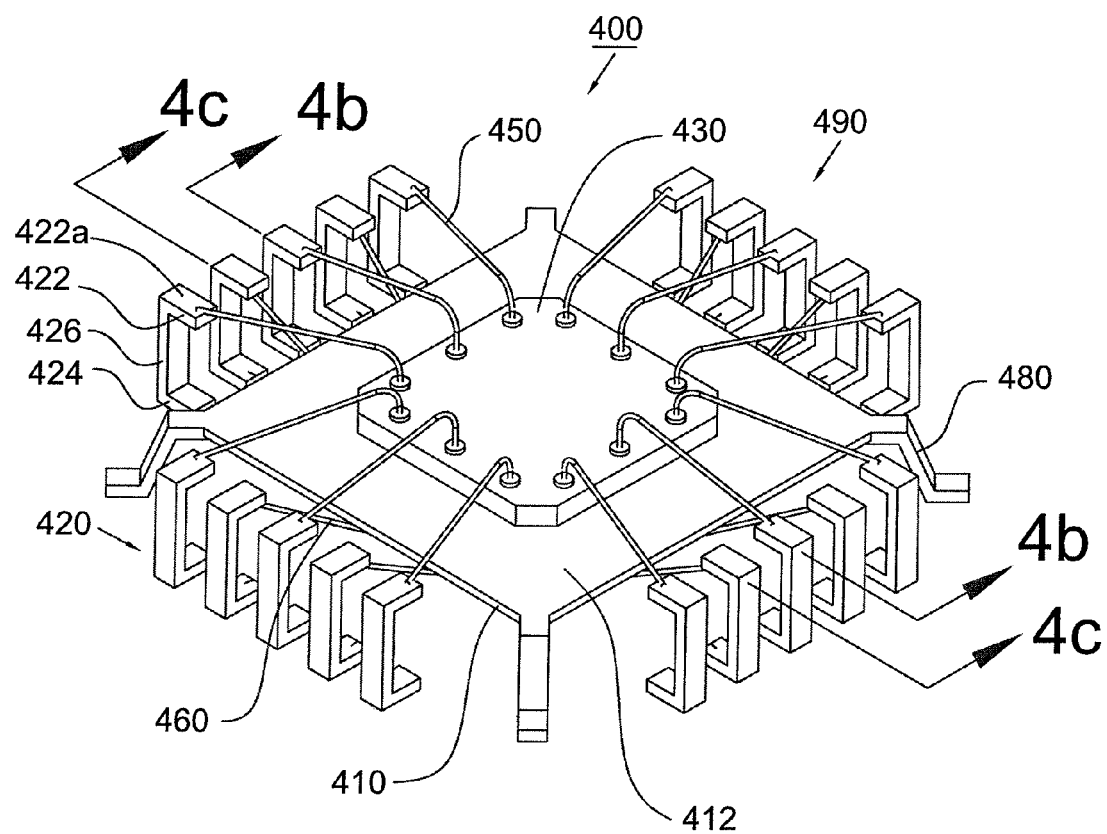
FIG. 4a is a perspective view of a multi-chip package according to an embodiment of the present invention.
Figure 4B:
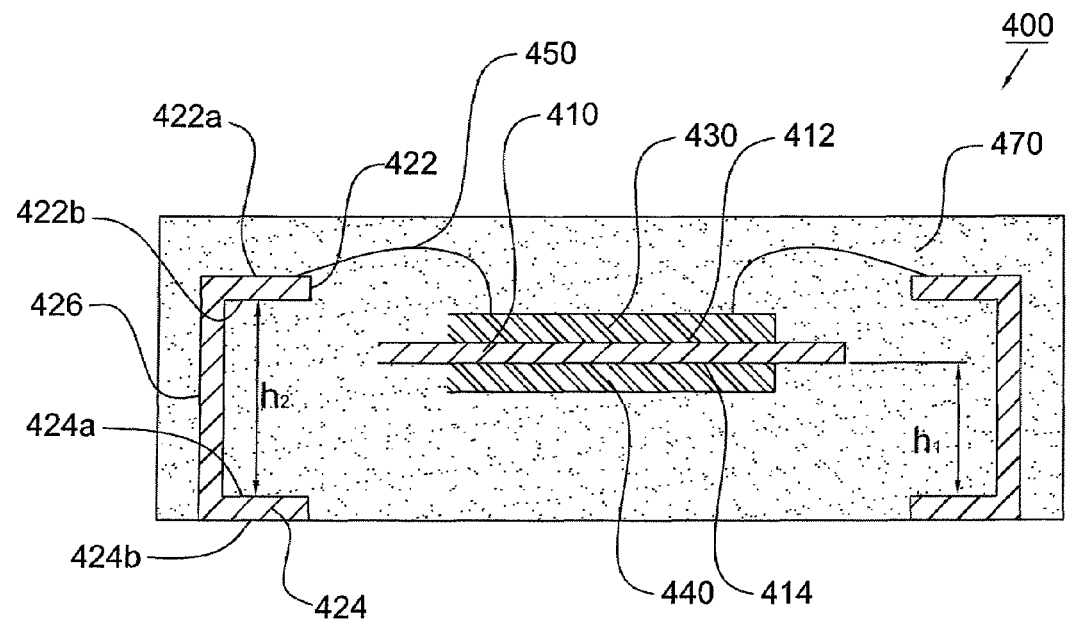
FIG. 4b is a cross-sectional view of the multi-chip package of FIG. 4a taken along line 4b-4b.
Figure 4C:
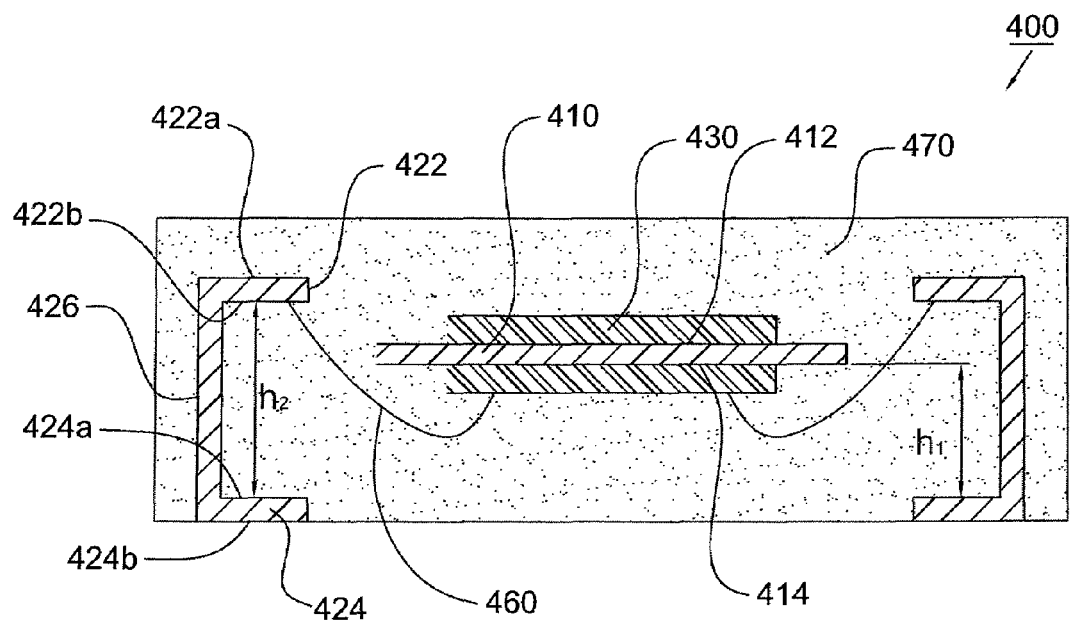
FIG. 4c is a cross-sectional view of the multi-chip package of FIG. 4a taken along line 4c-4c.

Referring to FIGS. 4a, 4b and 4c, a multi-chip package 400 according to an embodiment of the present invention includes a leadframe 490 having a die pad 410 and a plurality of leads 420 surrounding the die pad 410. Each of the leads 420 includes an upper lead 422, a lower lead 424 disposed below the upper lead 422 and an intermediate lead 426 substantially perpendicularly connected to the upper lead 422 and lower lead 424, wherein the upper lead 422 and lower lead 424 are substantially parallel to the die pad 410. Furthermore, the upper lead 422 has an upper surface 422a and a lower surface 422b, and the lower lead 424 has an upper surface 424a and a lower surface 424b. An upper chip 430 and a lower chip 440 are attached to the upper surface 412 and lower surface 414 of the die pad 410 respectively. The upper chip 430 is electrically connected to the upper surfaces 422a of the upper leads 422 of one part of the leads 420 (referred to as first leads) by a plurality of first bonding wires 450 (see FIG. 4b). The lower chip 440 is electrically connected to the lower surfaces 422b of the upper leads 422 of the other part of the leads 420 (referred to as second leads) by a plurality of second bonding wires 460 (see FIG. 4c). A sealant 470 is used to encapsulate the chips 430, 440 and bonding wires 450, 460 to protect these elements from damage.

In order to have the multi-chip package 400 capable of being electrically connected to an external circuitry, the lower surfaces 424b of the lower leads 424 are exposed out of the sealant 470. In addition, in order to decrease the thickness of the package 400, the height h1 from the die pad 410 to the lower leads 424 is less than the height h2 from the upper leads 422 to the lower leads 424.

As the multi-chip package 400 of the present invention uses only a single leadframe 490 to carry two chips 430, 440 in a package, the object of using only a single leadframe to carry more than one chip is therefore carried out. Moreover, since the chips 430 and 440 are disposed respectively on the opposing surfaces of the die pad 410 and when the tie bars 480 which support the die pad 410 in place are electrically connected to external ground traces (not shown), the die pad 410 can function as an electromagnetic interference (EMI) shielding for the two chips 430, 440 and therefore the interference between these chips 430 and 440 can be avoided. Also, the die pad 410 is capable of functioning as thermal paths to dissipate the heat generated from the chips 430, 440 when they operate to the environment.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A multi-chip package, comprising:
    a leadframe, comprising:
        a die pad having opposing upper and lower surfaces; and
        a plurality of leads surrounding the die pad, comprising a plurality of first leads and a plurality of second leads, each of the leads having an upper lead, a lower lead disposed below the upper lead and an intermediate lead connected to the upper lead and lower lead, wherein each of the lower leads having opposing upper and lower surfaces, each of the upper leads having opposing upper and lower surfaces;
    an upper chip attached to the upper surface of the die pad;
    a lower chip attached to the lower surface of the die pad;
    a plurality of first bonding wires electrically connecting the upper chip to the upper surfaces of the upper leads of the first leads;
    a plurality of second bonding wires electrically connecting the lower chip to the lower surfaces of the upper leads of the second leads; and
    a sealant encapsulating the upper chip, lower chip, first bonding wires and second bonding wires.

2. The multi-chip package as claimed in claim 1, wherein the lower surfaces of the lower leads of the first and second leads are exposed out of the sealant.

3. The multi-chip package as claimed in claim 1, wherein the height from the die pad to each of the lower leads of the first and second leads is less than the height from each of the upper leads of the first and second leads to each of the lower leads of the first and second leads.

4. The multi-chip package as claimed in claim 2, wherein the height from the die pad to each of the lower leads of the first and second leads is less than the height from each of the upper leads of the first and second leads to each of the lower leads of the first and second leads.

5. The multi-chip package as claimed in claim 1, wherein the upper and lower leads of the first and second leads are substantially parallel to the die pad.

6. The multi-chip package as claimed in claim 1, wherein the intermediate leads are substantially perpendicularly connected to the upper and lower leads.

7. A leadframe, comprising:
    a die pad; and
    a plurality of leads surrounding the die pad, each of the leads having an upper lead, a lower lead disposed below the upper lead and an intermediate lead connected to the upper lead and lower lead, each of the lower leads having opposing upper and lower surfaces, each of the upper leads having opposing upper and lower surfaces;
    wherein the height from the die pad to each of the lower leads is less than the height from each of the upper leads to each of the lower leads.

8. The leadframe as claimed in claim 7, wherein the upper and lower leads are substantially parallel to the die pad.

9. The leadframe as claimed in claim 7, wherein the intermediate leads are substantially perpendicular to the upper and lower leads.

10. The leadframe as claimed in claim 8, wherein the intermediate leads are substantially perpendicular to the upper and lower leads.

* * * * *